United States Patent
Donati et al.

(10) Patent No.: US 9,397,616 B2
(45) Date of Patent: Jul. 19, 2016

(54) QUASI-DOHERTY ARCHITECTURE AMPLIFIER AND METHOD

(71) Applicant: CommScope Technologies LLC, Hickory, NC (US)

(72) Inventors: Marcello Donati, Milan (IT); Fortunato Facchinetti, Brignano Gera d'adda (IT)

(73) Assignee: CommScope Technologies LLC, Hickory, NC (US)

( * ) Notice: Subject to any disclaimer, the term of this patent is extended or adjusted under 35 U.S.C. 154(b) by 43 days.

(21) Appl. No.: 14/280,279

(22) Filed: May 16, 2014

(65) Prior Publication Data

US 2015/0123734 A1     May 7, 2015

Related U.S. Application Data

(60) Provisional application No. 61/900,477, filed on Nov. 6, 2013.

(51) Int. Cl.
| | | |
|---|---|---|
| H03F 3/68 | (2006.01) | |
| H03F 1/02 | (2006.01) | |
| H03F 3/24 | (2006.01) | |
| H03F 3/217 | (2006.01) | |
| H03F 3/60 | (2006.01) | |
| H03F 1/07 | (2006.01) | |

(52) U.S. Cl.
CPC ............ *H03F 1/0288* (2013.01); *H03F 3/2171* (2013.01); *H03F 3/245* (2013.01); *H03F 3/604* (2013.01); *H03F 1/07* (2013.01); *H03F 3/68* (2013.01); *H03F 2200/192* (2013.01); *H03F 2200/204* (2013.01); *H03F 2200/255* (2013.01); *H03F 2200/423* (2013.01); *H03F 2200/451* (2013.01)

(58) Field of Classification Search
CPC ......... H03F 3/211; H03F 3/602; H03F 3/604; H03F 3/72; H03F 1/0288; H03F 3/24; H03F 2200/451
USPC ............................................... 330/124 R, 295
See application file for complete search history.

(56) References Cited

U.S. PATENT DOCUMENTS

| | | | |
|---|---|---|---|
| 7,193,472 B2 * | 3/2007 | Gotou et al. .................. | 330/295 |
| 7,362,170 B2 | 4/2008 | Louis | |

(Continued)

FOREIGN PATENT DOCUMENTS

| | | |
|---|---|---|
| EP | 2262107 A1 | 12/2010 |
| EP | 2472719 | 7/2012 |

OTHER PUBLICATIONS

Thirteen-Page International Search Report and Written Opinion mailed Apr. 15, 2015 International Application No. PCT/US2014/060613.

(Continued)

*Primary Examiner* — Khanh V Nguyen
(74) *Attorney, Agent, or Firm* — Myers Bigel & Sibley, P.A.

(57) ABSTRACT

An amplifier including a main amplifier circuit and at least one peaking amplifier circuit. The peaking amplifier circuit is selectively operable to operate in combination with the main amplifier circuit. The main amplifier circuit and the peaking amplifier circuit each include an active device operation as an inverse Class-F amplifier element. The main amplifier circuit and the peaking amplifier circuit also each include a combined matching and resonator network coupled with an output of the respective active device so the active device operates as an inverse Class-F device, and a combined matching and resonator network coupled with an input of the respective active device.

20 Claims, 10 Drawing Sheets

(56) References Cited

U.S. PATENT DOCUMENTS

| | | | |
|---|---|---|---|
| 7,663,435 | B2 | 2/2010 | Kim et al. |
| 8,180,303 | B2 | 5/2012 | Dupuy et al. |
| 8,274,332 | B2 * | 9/2012 | Cho et al. .................. 330/295 |
| 8,324,965 | B2 | 12/2012 | Meng |
| 8,736,375 | B2 | 5/2014 | Murao |

OTHER PUBLICATIONS

Thirty-Page, Andrei Grebennikov, et al.: "High Efficiency Doherty Power Amplifiers: Historical Aspect and Modern Trends"; Proceedings of the IEEE; IEEE; New York, US; vol. 100, No. 12; Dec. 1, 2012; pp. 3190-3219; DOI: 10.11091JPROC.2012, 2211091 figures 10a, 10c, 12, 13a, 14.

Seven-Page, Invitation to Pay Additional Fees and, Where Applicable, Protest Fee and Communication Relating to the Results of the Partial International Search; mailed Jan. 12, 2015; International Application No. PCT/US2014/060613.

Eight-Page, Minwoo Cho, et al.: "Doherty Power Amplifier Based on the Class-F Load Network*".

Ten-Page, Xi Yao, et al.: "Analysis and Design of the Doherty Amplifier Based on Class F and Inverse Class F Amplifiers"; Microwave Journal, Mar. 2010.

* cited by examiner

QUASI-DOHERTY ARCHITECTURE AMPLIFIER AND METHOD

RELATED APPLICATIONS

This application is a non-provisional application that claims the priority of U.S. Provisional Patent Application No. 61/900,477, filed Nov. 6, 2013, and entitled "AN INVERSE CLASS-F AMPLIFIER USED FOR THE QUASI-DOHERTY ARCHITECTURE", which provisional application is incorporated herein by reference in its entirety.

INTRODUCTION

RF amplifiers are utilized for a variety of applications in wireless communication systems, such as to amplify and transmit a downlink signal at a base transceiver station (BTS). As a result, the amplifiers must be able to handle the power requirements that are associated with such wireless communication systems. Particularly, amplifiers that are used for handling signals and applications having high peak-to-average signal ratios must be able to handle or deliver significant peak power levels that are above their normal or average load levels. For example, in order to amplify a signal with a 10 dB peak-to-average ratio, while creating a minimal amount of non-linear distortion in the signal, an amplifier must be capable of delivering a peak level of around 200 watts of power to generate an output signal that has an average power level of 20 watts.

RF power amplifiers with high efficiency performance and low distortion are, therefore, required for wireless communication systems. Often a tradeoff between one of these two parameters, efficiency and distortion, must be made by applying linearization techniques (adaptive predistortion, feedforward, EER, LING, etc.) and/or choosing the best topology of the amplifier (biasing class, circuit architecture as push-pull, Doherty, etc.). In particular, the optimized choice of the biasing class for the amplifier is limited by high values of PAR (Peak-to-Average Ratios) of the input signal waveform that have been specifically required in many wireless communication systems. Consequently, a Class-AB amplifier is typically adopted as a power amplifier final stage for such systems.

Typically, the closer to saturation an amplifier is operated, the greater the amount of nonlinear distortion it products in the output signals. Therefore, it has become standard practice to decrease or "back off" the amplifier power output until the nonlinear distortion is at an acceptable level. As a result, for handling high peak-to-average signal ratio applications in an amplifier, several amplification devices are usually operated together and have their outputs combined. In such an amplifier, the devices or sub-amplifiers are operated inefficiently most of the time at low power levels in order to be able to deliver, somewhat more efficiently, the maximum power levels for the relatively short period of time when the high peaks in the signal are to be amplified.

The Doherty amplifier architecture improves amplifier efficiency by effectively reducing the amplifier's saturated power level when the signal level is low, yet quickly ramping up to full power capability when the signal peaks demand it. Classically, the Doherty design uses a main amplifier and an auxiliary or peaking amplifier, and uses quarter-wavelength transmission lines at the output as impedance transforming and inverting elements. Such elements are somewhat large, and generally are not readily reduced for surface mounting on printed circuit boards. Additionally, in some instances those quarter-wavelength transmission lines may limit the bandwidth over which the amplifier can efficiently operate. Furthermore, it is often difficult to implement the classic Doherty design for low frequencies because of the physical size of quarter-wavelength transmission lines that are used.

While the implementation of a Doherty amplifier architecture has addressed various of the concerns regarding the trade-off between linear operation and efficiency, generally, the Class-AB amplifier implementation at the final stages of such systems still provides a limit on the overall efficiency that is achieved. Generally, an RF power amplifier includes a certain number of stages in order to obtain a required level of the desired output signal. Each stage operates with one or more active devices, such as transistors, that display non-linear behavior. Usually, the last stage of an amplifier is characterized by the maximum non-linearity because it is driven from the highest signal level, which has been amplified from previous amplifier stages. Also, the final amplifier stage often contributes significantly to the thermal dissipation of the overall power amplifier.

Attempts have been made to improve linearity and efficiency using Class AB amplifiers by implementing a modified Doherty amplifier architecture. U.S. Pat. Nos. 6,922,102 and 7,064,606, for example, provide implementations of a quasi-Doherty amplifier architecture for improving efficiency. Such U.S. patents are incorporated herein by reference in their entireties. However, such implementations still utilize amplifier classes (e.g., A, B, AB, C, etc.) in the final stages of both the main amplifier and the peaking or auxiliary amplifier in the design. Such amplifier classes are based upon the bias point of the active devices.

There is still a need to further improve the efficiency of such amplifiers, while maintaining desirable linearity. Thus, there is also still a need for improvement in current power amplifier designs, and particular for improvement in power amplifier designs utilized for wireless communications.

SUMMARY OF THE INVENTION

An amplifier includes a main amplifier circuit and at least one peaking amplifier circuit. The peaking amplifier circuit is selectively operable to operate in combination with the main amplifier circuit. The main amplifier circuit and the peaking amplifier circuit are each configured for operating as an inverse Class-F amplifier. A coupler circuit is coupled with outputs of the main amplifier circuit and the peaking amplifier circuits to combine amplifier circuit output signals at a coupler first output port. The coupler second output port is terminated with a termination operable for providing a reflection coefficient that is based upon the reflection coefficient at the output of at least one of the main amplifier circuit and the peaking amplifier circuit. Each of the main amplifier circuit and peaking amplifier circuit includes an active device. A combined matching and resonator network is coupled with an output of the respective active devices so the active devices operate as inverse Class-F devices. A combined matching and resonator network is also coupled with an input of the respective active devices.

It should be understood that the appended drawings are not necessarily to scale, presenting a somewhat simplified representation of various preferred features illustrative of the basic principles of embodiments of the invention. The specific design features of the system and/or sequence of operations as disclosed herein, including, for example, specific dimensions, orientations, locations, and shapes of various illustrated components, will be determined in part by the particular intended application and use environment. Certain features of the illustrated embodiments may have been enlarged, distorted or otherwise rendered differently relative to others to facilitate visualization and clear understanding.

DETAILED DESCRIPTION OF EMBODIMENTS OF THE INVENTION

The present invention, in various embodiments, incorporates an inverse Class-F amplifier device implementation, within a quasi-Doherty amplifier architecture, for both the main and one or more peaking amplifiers. Furthermore, the invention incorporates a combination matching and resonator network on both the input of the amplifier devices, and output of the amplifier devices, so they act as inverse Class-F amplifiers, in accordance with the invention. Such inverse Class-F amplifiers operate in a completely different way from traditional amplifiers that are incorporated within traditional Doherty designs, and provide improvements in efficiency, and circuit layout, by implementing minimally-sized input and output microstrip networks.

In understanding an inverse Class-F amplifier operation in accordance with a feature of the invention, a discussion of Class-F amplifier operation is useful. The operation of a Class-F power amplifier is based upon achieving open circuit or short circuit impedances at various harmonic frequencies. Generally, high efficiency power amplifiers (all biasing classes apart from Class-A) are characterized by current and voltage waveforms containing harmonics at the output pin of the active device (e.g., "drain" for a MOSFET device, "collector" for a bipolar device). The output network of such an amplifier has to prevent significant harmonics level at the output load while, at the same time, optimizing the impedance matching at the fundamental frequency of the amplified signal. Each harmonic signal level contribution to the current and voltage signals at the output pin of the active device is determined from the impedance value of the circuit at the harmonic frequency.

For discussion purposes, consider an active device that is modeled with an ideal voltage controlled current source at the device output, and a lossless network between the output and the load. In a Class-F amplifier design, this ideal network produces zero impedance at all even harmonics and infinite impedance at all odd harmonics. Moreover, such an ideal network allows a perfect matching between the active device output and a load.

The Fourier series of the output voltage and current waveforms for a Class-F amplifier can be defined respectively, as set forth in Equations 1 and 2 below:

$$v_{out}(t) = V_0 + \frac{4}{\pi}V_0\sin\omega t + \frac{4}{3\pi}V_0\sin 3\omega t + \frac{4}{\pi}V_0 \sum_{n=5,7,...}^{N} \frac{\sin n\omega t}{n} \quad \text{EQUATION 1}$$

$$i_{out}(t) = \frac{I_0}{\pi} - \frac{I_0}{2}\sin\omega t - \frac{2}{3}\frac{I_0}{\pi}\cos 2\omega t - 2\frac{I_0}{\pi} \sum_{n=4,6,...}^{N} \frac{\cos n\omega t}{n^2-1} \quad \text{EQUATION 2}$$

However, the inverse Class-F amplifier output network ideally produces infinite impedance at all even harmonics and zero impedance at all odd harmonics. Such an inverse Class-F amplifier is characterized by the following Fourier series of the output current and voltage waveforms, as set forth in Equations 3 and 4 below:

$$i_{out}(t) = I_0 + \frac{4}{\pi}I_0\sin\omega t + \frac{4}{3\pi}I_0\sin 3\omega t + \frac{4}{\pi}I_0 \sum_{n=5,7,...}^{N} \frac{\sin n\omega t}{n} \quad \text{EQUATION 3}$$

$$v_{out}(t) = \frac{V_0}{\pi} - \frac{V_0}{2}\sin\omega t - \frac{2}{3}\frac{V_0}{\pi}\cos 2\omega t - 2\frac{V_0}{\pi} \sum_{n=4,6,...}^{N} \frac{\cos n\omega t}{n^2-1} \quad \text{EQUATION 4}$$

Figure 1:
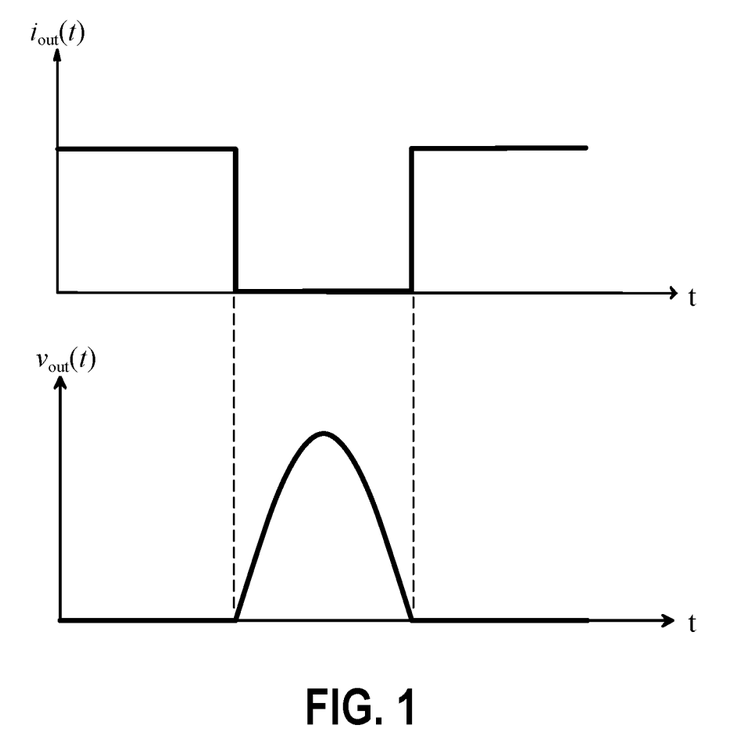
FIG. 1 is a schematic view of current and voltage waveforms for an inverse Class-F amplifier.

Consequently, the ideal inverse Class-F current and voltage waveforms are also illustrated in FIG. 1. The out-of-phase characteristics of the waveforms guarantee no overlap between the current and the voltage, so no power is ideally dissipated from the active device and theoretically the efficiency reaches a figure of 100%.

Figure 2:
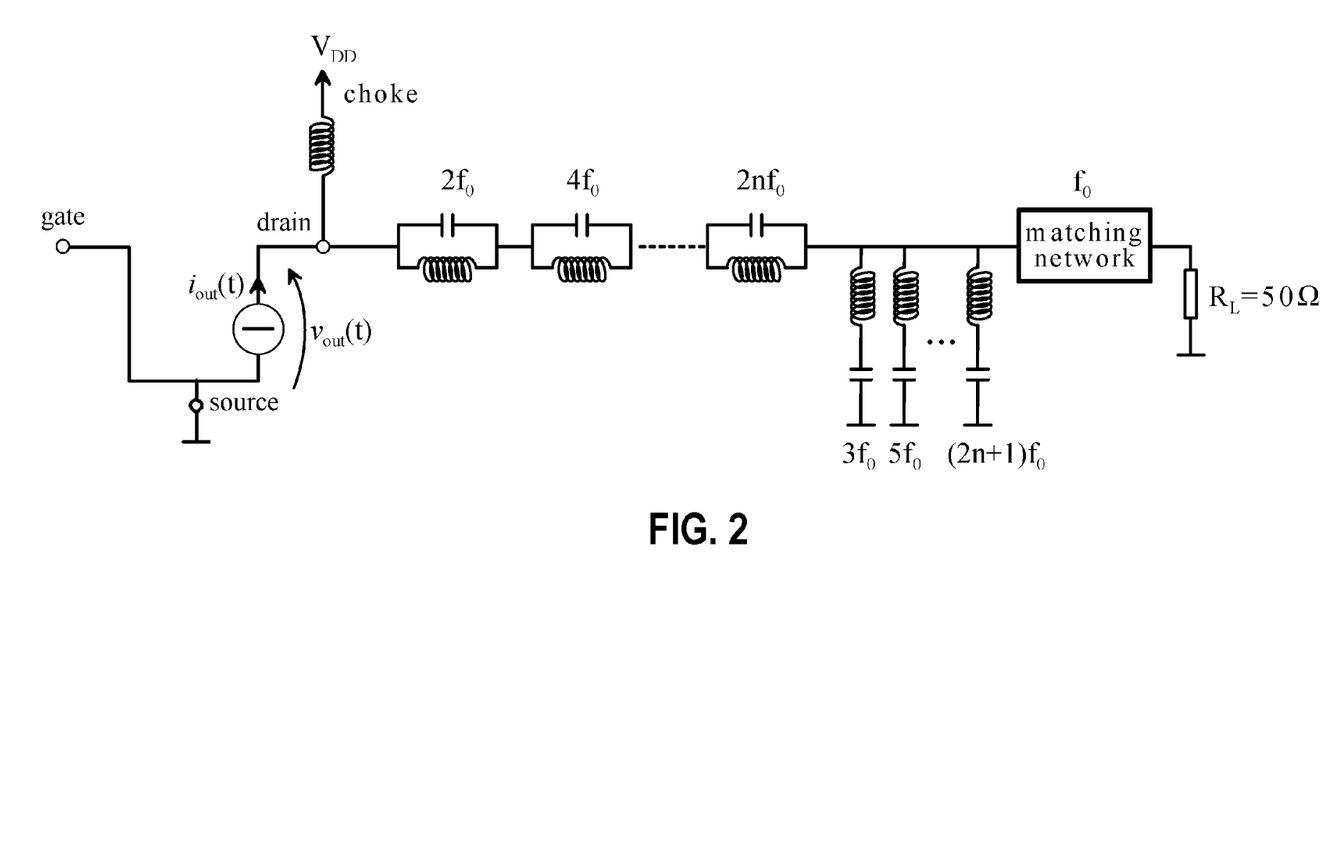
FIG. 2 is an illustrative schematic view of an ideal inverse Class-F amplifier.

An illustrative schematic of an ideal inverse Class-F amplifier is presented in FIG. 2. The ideal circuit has a number of resonators, and assumes that every resonator is ideal, so each parallel resonator is a short circuit at each odd harmonic frequency component $(2n+1)f_0$, and is an open circuit at each even harmonic frequency component $2nf_0$, and vice-versa for each serial resonator. That is, in operation, the second harmonic component at the output or drain cannot pass through the parallel LC $2f_0$ resonator, and so that harmonic component comes back to the drain. Similarly, the fourth harmonic is stopped by the LC $4f_0$ resonator, and comes back to the drain. This occurs repeatedly for other even harmonics and for each noted parallel resonator. Consequently, the drain or output of the inverse Class-F device "sees" an open circuit condition (high load impedance) for each even harmonic component of the signal. The odd harmonic components can pass through the cascade of these parallel resonators. However, each odd harmonic component is then short circuited to ground by the corresponding serial LC $(2n+1)f_0$ resonator, as shown. So, the output or drain effectively "sees" a short circuit condition (zero load impedance) for each odd harmonic component. Therefore, for an ideal operation of an inverse Class-F amplifier, the drain voltage waveform will contain only contributions from even harmonic components. That is, there is a voltage drop if the load is open. Conversely, the drain current waveform will contain only contributions from odd harmonic components. That is, the current flows through a closed loop only.

The fundamental $f_0$ frequency component of the signal to be amplified can pass through the parallel LC $2nf_0$ resonators, and is not short circuited to ground by the serial $(2n+1)f_0$ resonators. Therefore, the fundamental frequency signal component can reach the 50 Ohm load. As illustrated in FIG. 1, the inverse Class-F amplifier has a larger drain peak voltage value than that of a standard Class-F device (half-sine waveform instead of square waveform). Therefore, it may have a reliability issue due to the breakdown of the device. Therefore, in one embodiment of the invention, a gallium-nitride (GaN) high electron mobility transistor (HEMT) is preferred for the inverse Class-F amplifier design of this application, because such a technology allows for a higher breakdown figure. However, the invention is not limited to such technology and might include an LDMOS device or other active device.

In reality, an implemented amplifier circuit is very different from the ideal circuit. Typically, a Class-F amplifier will be referred to as a "third harmonic peaking" amplifier, and an inverse Class-F amplifier will be referred to as "second harmonic peaking" amplifier because only second and third harmonics are generally realistic at the operating frequency from 1 GHz up to 3 GHz. In particular, the inverse Class-F output network of one embodiment of the invention will produce effectively an infinite impedance at the second harmonic frequency, and effectively a zero impedance at the third harmonic frequency. The impedances at the higher harmonic frequencies will all generally be around zero, due to a short circuit produced by an output capacitance of the circuit, such as a parasitic output capacitance between the drain and source of the active transistor device.

Figure 3:
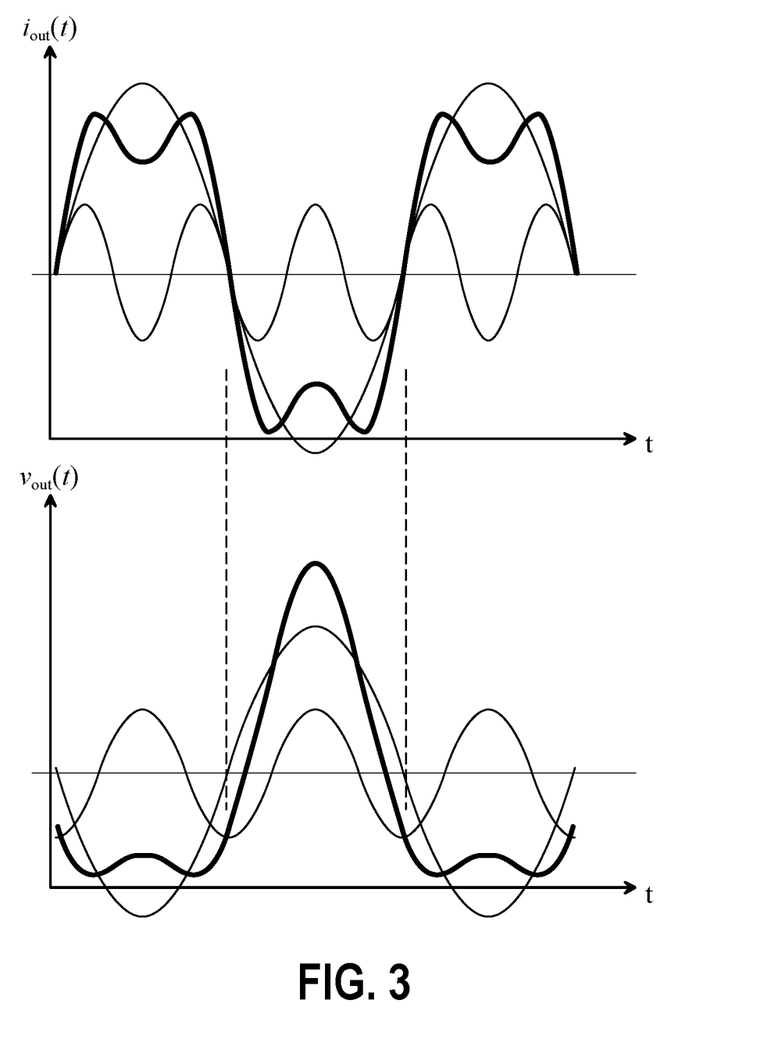
FIG. 3 is a schematic diagram of inverse Class-F current and voltage waveforms.

Consequently, the real inverse Class-F current and voltage waveforms would be similar to those illustrated in FIG. 3, where the fundamental frequency, second harmonic, and third harmonic components are indicated. The illustration in FIG. 3 is considered a somewhat ideal situation for an inverse Class-F amplifier with the first three harmonic components. In each graph, the thick curve, as illustrated, equals the sum of the two thin curves showing the contributions to the signal waveform from the fundamental frequency signals, and various harmonic frequency signal components. In the upper, drain current graph $i_{out}(t)$, the two thin curves represent the contributions from the signal at the fundamental frequency $f_0$, and at the third harmonic $3f_0$. The contributions from the even harmonic components or the second harmonic signal $2f_0$ are equal to zero, because the drain current $i_{out}(t)$ does not have contributions from the even harmonics due to the open circuit condition the inverse Class-F device presents. In the lower, drain voltage graph $v_{out}(t)$, the two thin curves represent the contributions from the signal at the fundamental frequency $f_0$ and at the second harmonic $2f_0$. The contribution from the odd harmonics or third harmonic $3f_0$ is equal to zero because the drain voltage $v_{out}(t)$ does not have contributions from the odd harmonics due to the short circuit condition. In actuality, the waveforms can be even more distorted than illustrated, and the overlapping between current and voltage waveforms can increase, thus, worsening the power amplifier efficiency.

In an ideal condition, there should be no overlap between the voltage and current waveforms yielding a power efficiency of 100%. That is, the current at the output pin of the active device would include one or more odd harmonics, and would approximate a square wave, as illustrated in FIG. 1. Alternatively, the voltage waveform would include even harmonics that would approximate a half-sine waveform (See FIG. 1). However, since such devices are not ideal, there is overlap between the voltage and current waveforms, thus, yielding a power-added efficiency (PAE) equal to 81% for an inverse Class-F amplifier having contributions from the third harmonic components, as illustrated in FIG. 4.

Figure 4:
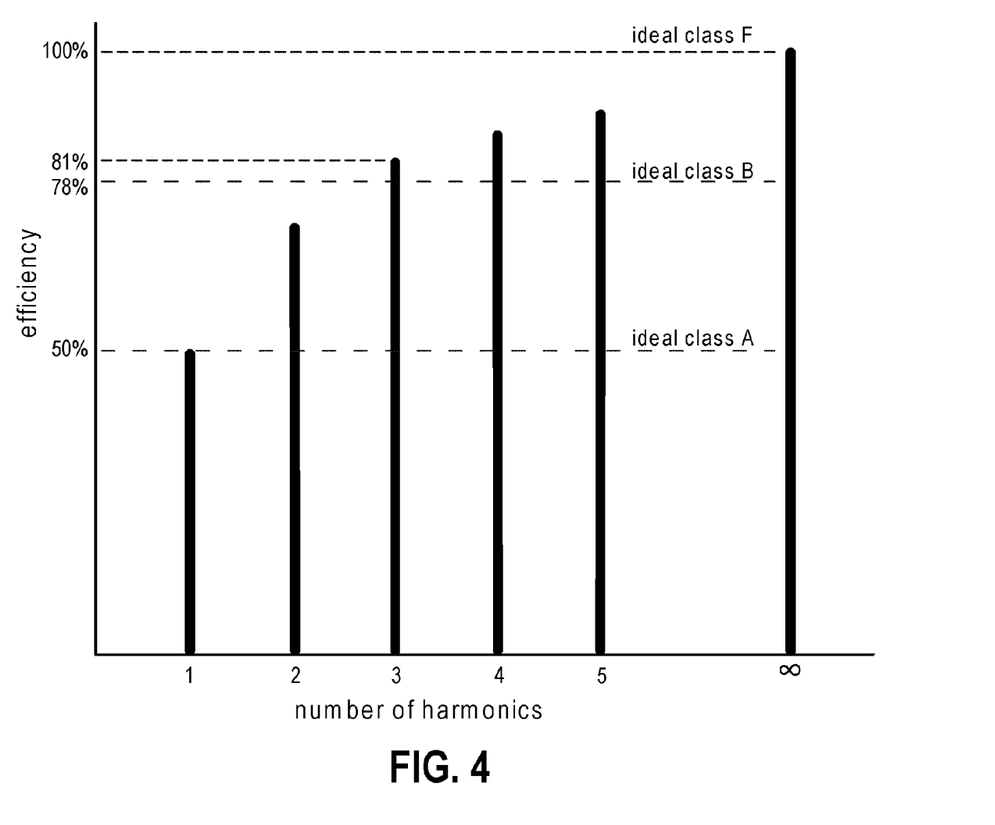
FIG. 4 is a graph of Power Added Efficiency (PAE) figures for a power amplifier at different harmonics.

The maximum PAE (Power Added Efficiency) figure of a power amplifier considering different number of harmonics is depicted in FIG. 4 to be compared with ideal Class-A and Class-B amplifiers. A Class-F amplifier with second and third harmonics can give a maximum PAE of 81% even if a figure of about 75% could represent the best realistic performance.

Table 1 summarizes the conditions required at the output of the active device for Class-F topology and the inverse Class-F topology used in the present invention.

TABLE 1

| Frequency component | Class-F drain condition | Inverse Class-F drain condition |
|---|---|---|
| Fundamental | Impedance matching | Impedance matching |
| Second harmonic | Short circuit | Open |
| Third harmonic | Open | Short circuit |

As noted herein, an inverse Class-F amplifier has voltage and current waveforms that are exchanged, or essentially opposite to, the same waveforms for a Class-F amplifier. That is, the voltage waveform includes contributions from signals at even harmonics to the fundamental frequency $f_0$, because the output of the active device experiences a short circuit condition for signals at odd harmonics to the fundamental frequency. Conversely, the current waveform includes only contributions at odd harmonics because the output of the device experiences an open circuit condition for signals at even harmonics to the fundamental frequencies. In accordance with one aspect of the invention, the utilization of an inverse Class-F amplifier provides the advantage of an easier implementation in a circuit because the required open circuit condition exists at the output for the lower harmonic frequencies, for example, the second harmonic frequency rather than the third harmonic frequency. This offers an advantage in the amplifier design, as noted hereinbelow.

Figure 5:
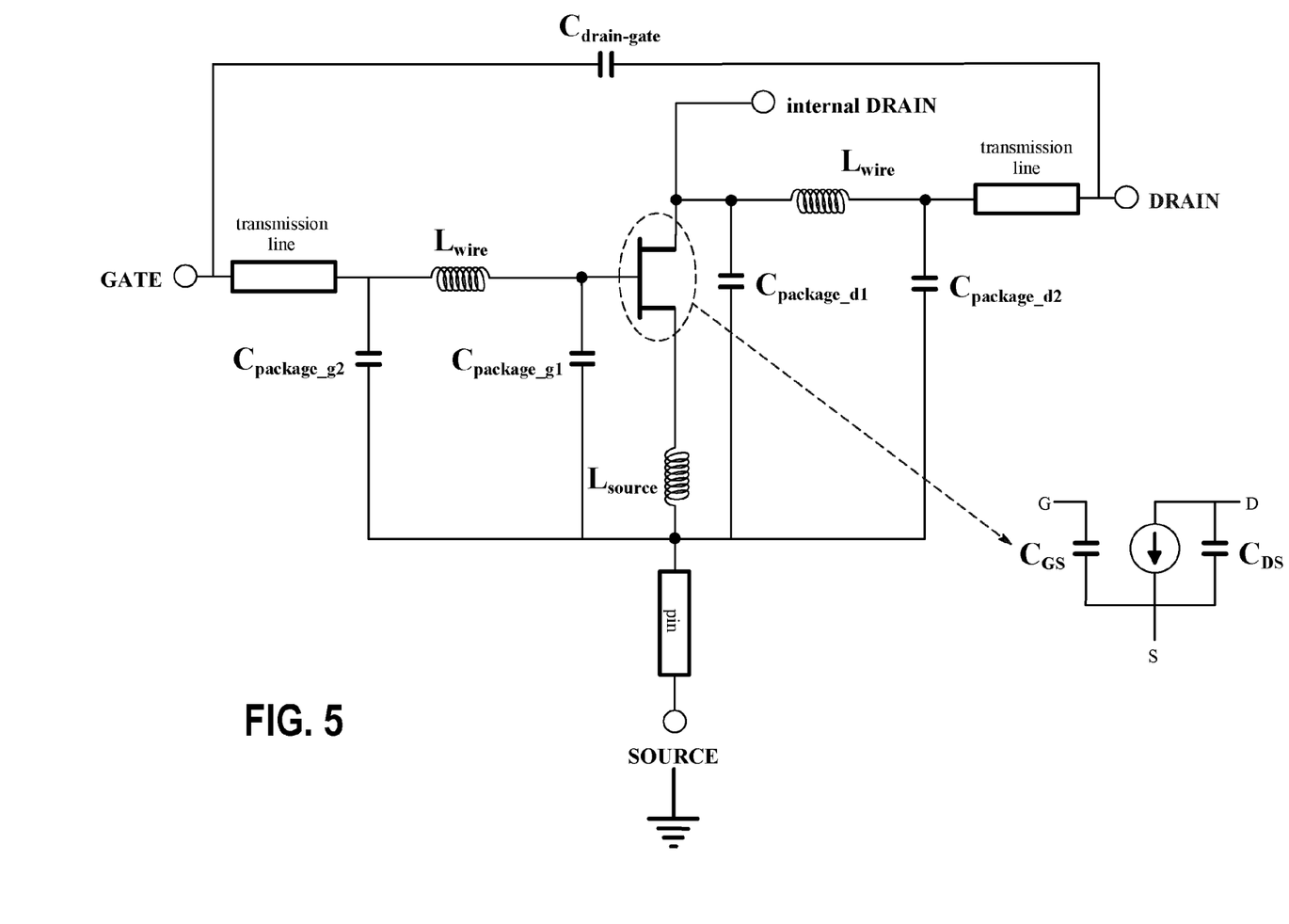
FIG. 5 is a circuit diagram of an active device used for signal amplification illustrating parasitic effects of the circuit.

In accordance with another aspect of the invention, an inverse Class-F amplifier is utilized in both the main and peaking amplifiers of a quasi-Doherty architecture, as disclosed herein, rather than having different amplifier classes or topologies between the main and peaking amplifiers. Such an inventive configuration and use of the inverse Class-F architecture addresses the parasitic effects of the active device that are presented at both the input and output of the amplifier circuit. For example, the parasitic effect at the output terminal of the active device may be modeled by a series inductance that does not allow a perfect short circuit at the intrinsic active terminal devices. On the other hand, the parasitic drain-source capacitance is not small enough to provide low impedance by itself at the second harmonic. As illustrated in FIG. 5, the active device to be used for signal amplification, such as a MOSFET transistor, presents both input and output parasitic effects due to the packaging and interconnections between the internal contacts of the transistor die and the pins of the package. FIG. 5 illustrates a typical equivalent circuit for the package parasitic effects of a circuit incorporating an active device used for amplification in an inverse Class-F arrangement. For example, the FIG. 5 circuit may be reflective of a model of a Cree CGH40025 GaN HEMT device with $P_{SAT}$=30W available from CREE of Durham, N.C., with typical model component values as follows:

$L_{wire}$=276 pH
$L_{source}$=21.7 pH
$C_{drain-gate}$=2 Ff
$C_{drain-gnd}$=34 Ff
$C_{gate-gnd}$=34 Ff In the example of FIG. 5, the transistor might be further reflected as shown, wherein the transistor reflects a model considering not only the voltage controlled current source, but also the input and output capacitances $C_{GS}$ and $C_{DS}$ that are around few picoFarads. Such intrinsic capacitances play a strategic role in terms of matching the amplifier circuit at the inputs and outputs at the fundamental frequency signals, and the various open and short circuit conditions provided at the noted even and add harmonics. In particular, the inverse Class-F amplifier utilized in the present invention provides an open circuit condition for a lower frequency, such as the second harmonic frequency, instead of the same condition for the third higher harmonic frequency, as with a Class-F design. This provides a significant advantage in the circuit design of the invention, due to the presence of $C_{GS}$ and $C_{Ds}$ that reduce the impedance at the higher frequencies. For example, using the inverse Class-F amplifier architecture of the invention, the drain-source capacitor will effectively short circuit at the higher harmonics, such as the third harmonic, as desired in the inventive design.

In accordance with another aspect of the invention, the inverse Class-F amplifier arrangement is implemented within a Doherty amplifier architecture having a main amplifier, and at least one auxiliary or peaking amplifier. Specifically in the invention, an inverse Class-F amplifier is incorporated in both the main and peaking amplifiers of a quasi-Doherty implementation utilizing an input coupler circuit for providing an input signal to the main and peaking amplifiers in combination with an output coupler circuit for combining the outputs of the amplifiers.

Figure 6:
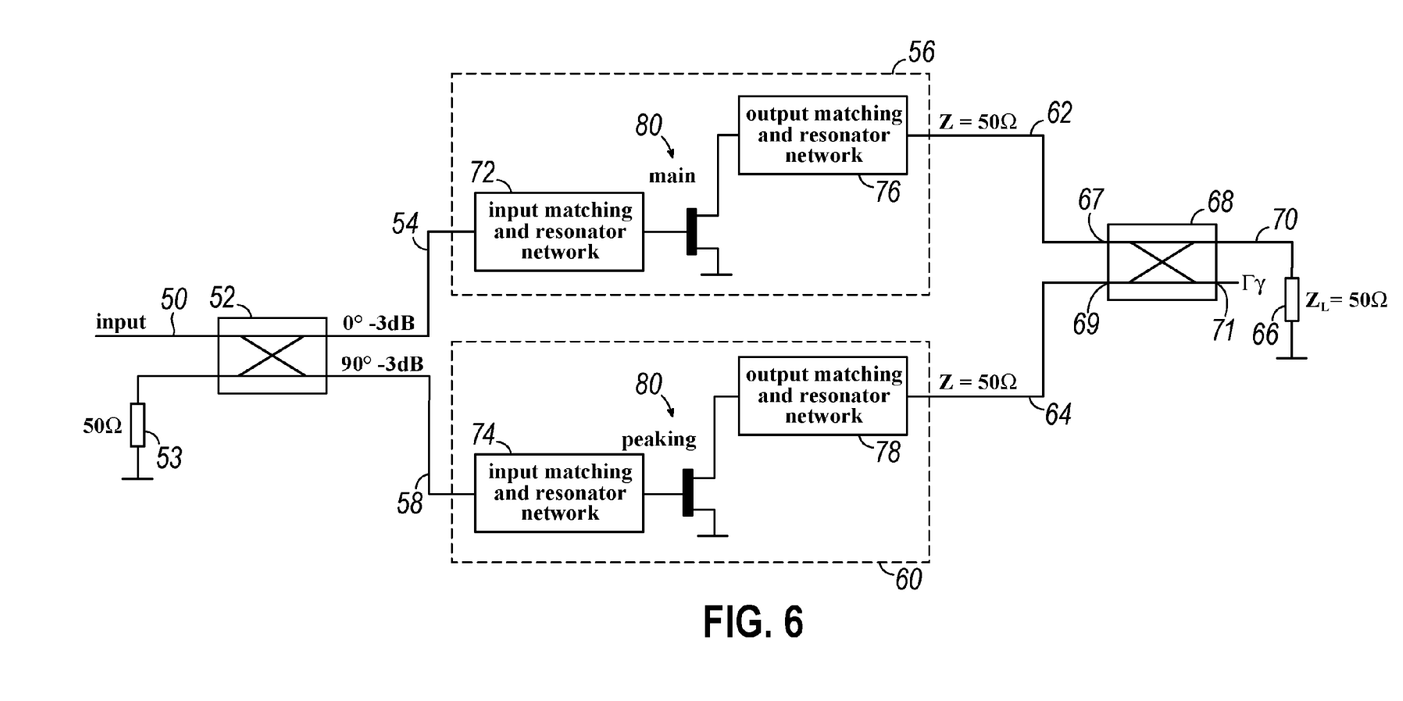
FIG. 6 is a schematic block diagram of an embodiment of the invention.

More specifically, referring to FIG. 6, an input signal to be amplified is provided on line 50 to one input port of a coupler circuit 52. The other input port is terminated through line 53 and resistor 55 to provide a 50 Ohm load to the input port. The coupler circuit 52 provides a split of the input signal on line 50 into multiple output signals for the main amplifier path and peaking amplifier path(s). In one example embodiment, the coupler circuit 52 is a 3 dB hybrid coupler device providing a generally equal split of the input signal 50 into two equal signals with one on path 54, directed to a main amplifier circuit 56 (main path), and one signal on path 58 directed to a peaking amplifier circuit 60 (peaking path). The signals are each amplified in their respective paths, and the outputs of each of the amplifier circuits 56, 60 are directed to 50 Ohm output lines 62, 64, respectively to be combined. The output signals of each of the amplifiers on lines 62, 64 are then combined by an output coupler circuit 68, and directed to a suitable load element 66 illustrated in FIG. 6 as a 50 Ohm load.

The combining of the outputs of a main amplifier circuit 56 and a peaking amplifier circuit 60 is indicative of a typical Doherty design. However, the invention also implements a coupler circuit 68 for combining the output signals of each of the amplifier circuits 56, 60 in order to provide s single output signal, rather than utilizing a typical Doherty matching network for such combination. Accordingly, as discussed herein the overall circuit design of FIG. 6 is referred to as a quasi-Doherty design, as illustrated in U.S. Pat. Nos. 6,922,104 and 7,064,606, for example. Coupler circuit 68 provides a combination of the amplified output signals that are input to the coupler circuit through appropriate input ports 67, 69. The coupler circuit provides an output of the combined signals to load element 66, through output port 70. The other output port 71 of the coupler circuit 68, which is often referred to as the isolation port, is terminated with a particular selectable termination that provides or presents a reflection coefficient $\Gamma_Y$ to that port 71. The magnitude of the reflection coefficient $\Gamma_Y$ will be one, and the angle of the reflection coefficient will be dependent upon the output reflection coefficient of the main amplifier circuit and peaking amplifier circuit, according to a specific relationship as discussed further in U.S. Pat. No. 7,064,606, which patent is incorporated by reference herein in its entirety.

In one embodiment of the invention, the output reflection coefficients $\Gamma_{OUT}$ of the main amplifier circuit 56, and peaking amplifier circuit 60 are assumed to be the same. Then, the reflection coefficient $\Gamma_Y$ might be selected for the output coupler circuit 68, according to Equation 5 or Equation 6 below:

$$\text{ang}(\Gamma_Y) = 180° - \text{ang}(\Gamma_{OUT}) \quad \text{EQUATION 5}$$

or $$\text{ang}(\Gamma_Y) = -\text{ang}(\Gamma_{OUT}) \quad \text{EQUATION 6}$$

As discussed in U.S. Pat. No. 7,064,606, the termination, in one example, might be provided by terminating a length of transmission line with one of an electrical short circuit, or an electrical open circuit. In doing so, if an open circuit termination is selected, the reflection coefficient of the termination $\Gamma_Y$, looking into the termination, may have an angle according to Equation 7:

$$\text{ang}(\Gamma_Y) = -2\Theta_{OC} \quad \text{EQUATION 7}$$

Alternatively, if a short circuit termination is selected, the reflection coefficient of the termination $\Gamma_Y$, looking into the termination, may have an angle according to Equation 8:

$$\text{ang}(\Gamma_Y) = 180 - 2\Theta_{SC} \quad \text{EQUATION 8}$$

The present invention, therefore, provides a unique implementation of inverse Class-F amplifiers, for at least one of the main and peaking amplifier circuits in the design. In accordance with one particular embodiment, the inverse Class-F amplifiers are used for both the main and peaking amplifier elements, within the quasi-Doherty amplifier construction, as illustrated in FIG. 6, to provide a significant improvement in efficiency to prior art amplifiers. For example, an increase in efficiency by more than 10% over typical Doherty amplifier designs that incorporates Class-A or Class-AB elements, is achieved. In one embodiment, the increase of efficiency is provided for RF power amplifiers operating up to a 3 GHz operating frequency. The inventive design provides such an advantage, generally at an output power of less than 50 dBm. By using an inverse Class-F amplifier circuit for both the main and peaking stages of the quasi-Doherty architecture, the efficiency is increased, while the linearity of the amplifier might be controlled, such as through an adaptive digital pre-distortion or other similar linearization technique, as would be known to a person of ordinary skill in the art.

Figure 7A:
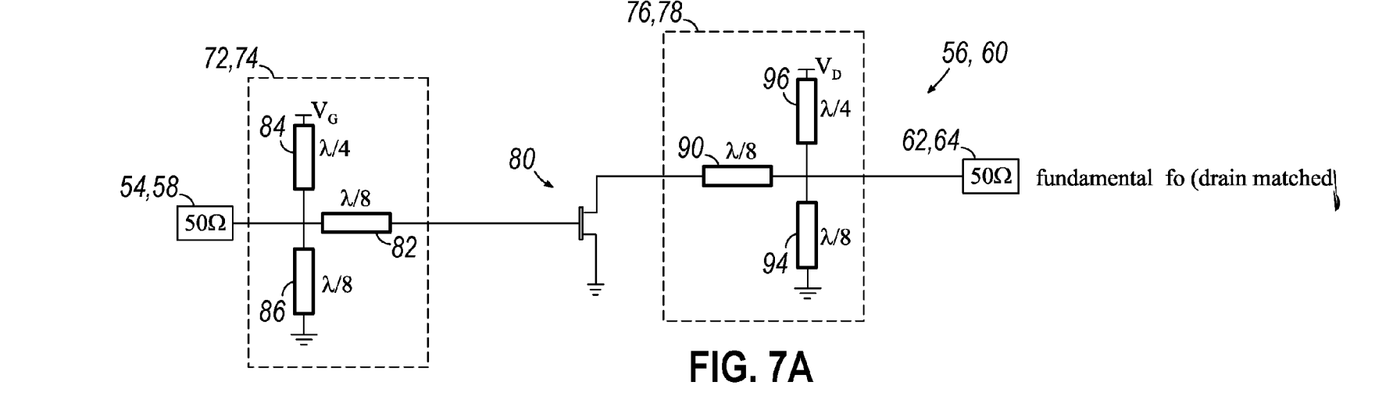
FIGS. 7A, 7B, and 7C are schematic circuit diagrams for the main and peaking amplifier circuits at a fundamental frequency, a secondary harmonic, and a third harmonic, respectively, in accordance with one aspect of the invention.

In accordance with another aspect of the invention, the inverse Class-F amplifiers also incorporate a combined matching and resonator network coupled with the output of the active device of the specific amplifier. In accordance with another aspect of the invention, the inverse Class-F amplifiers also incorporate a combined matching and resonator network coupled with the input of the active device of the specific amplifiers. In one particular embodiment, where each of the main amplifier circuit in 56 and the peaking amplifier circuit 60 uses the inverse Class-F elements, each amplifier utilizes unique input matching and resonator networks and output matching and resonator network incorporated into a unitary design. For example, such input and output matching and resonator networks might be incorporated into a unique microstrip arrangement, as discussed further herein. Referring to FIG. 7, the input matching and resonator networks 72, 74 provide the desirable signal matching properties and also the resonator properties to the inputs to the inverse Class-F amplifier elements of the inventive design. Similarly, the output matching and resonator networks 76, 78 provide such signal matching and resonator functions for the output signals of the main and peaking amplifier elements 80, as illustrated in FIG. 6. This provides the desirable operation of the overall amplifier, with its noted benefits, implementing an inverse Class-F element in each amplifier path, which is a completely different architecture from the amplifier architecture in the prior art that may, for example, use a Class-AB main amplifier and a Class-C peaking amplifier. The invention also provides a desirable increase in the efficiency of the overall amplifier design, as discussed herein.

In accordance with another aspect of the invention, the inverse Class-F amplifier elements of the invention and their input and output matching and resonator networks are implemented using unique input and output microstrip networks. The input and output networks are combined signal matching and resonator networks implemented with a unique combination of input or output line elements and stub elements. The active device, such as a transistor, in one exemplary embodiment, could be a GaN HEMT of Cree CGH40025 with $P_{SAT}$=30W tuned at 2140 MHz. The proposed embodiment uses such a circuit similar to that in FIG. 5, containing also an internal drain pin needed to monitor the drain voltage and current. Of course, other active devices might be implemented as appropriate, and so the invention is not limited to a specific active device or transistor.

Figure 7B:
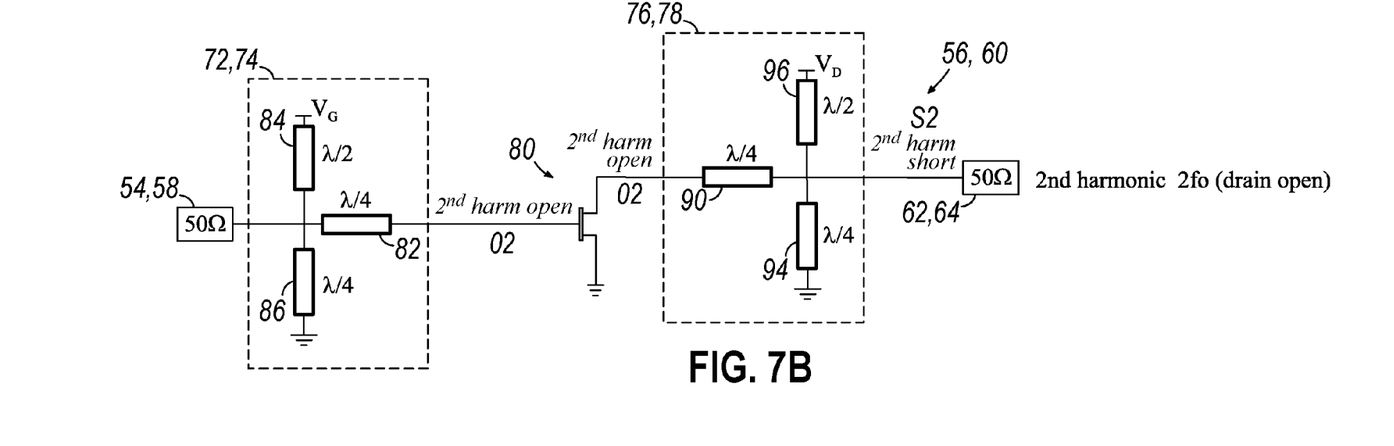
Figure 7C:
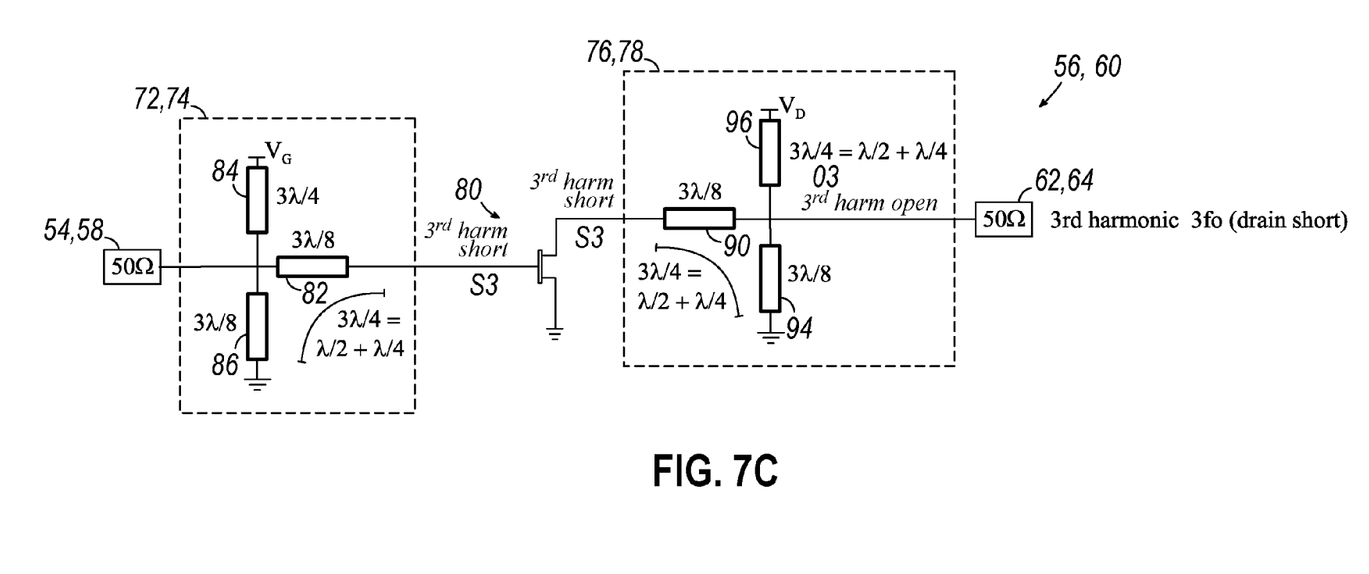

FIGS. 7A, 7B, and 7C illustrate the input matching and resonator networks 72, 74, and the output matching and resonator networks 76, 78 for one embodiment of the invention. The FIGS. 7A, 7B, and 7C illustrate the equivalent circuits for the input signals at the fundamental frequency, and at the second and third harmonic frequency components. The references used in FIGS. 7A-7C regarding "O2", "S2", "O3", "S3" refer to the equivalent circuit as being respectively, an open circuit at the second harmonic frequency, a short circuit at the second harmonic frequency, an open circuit at the third harmonic frequency, and a short circuit at the third harmonic frequency. More specifically, each of the FIGS. 7A-7C refers to an equivalent circuit reflective of one or both of the main amplifier circuit 56 or peaking amplifier circuit 60, as illustrated in FIG. 6. The active device 80 is configured as an inverse Class-F device, with the overall circuits 56, 60 providing the main amplifier and peaking amplifier functionality for the circuit design of FIG. 6.

As illustrated in FIG. 6, the circuits 56, 60 implement elements as shown in FIG. 7A for the main and peaking amplifier circuits that are coupled at the inputs to an input coupler circuit 52, and at the output to an output coupler circuit 68. The equivalent second harmonic circuit of FIG. 7B and third harmonic circuit of FIG. 7C are similarly arranged, either as a main amplifier circuit or peaking amplifier circuit accordingly. FIGS. 7A-7C illustrate a single active device 80 and amplifier circuit for discussion purposes, but as noted, each amplifier of the invention will have at least two such devices and circuits, one as a main amplifier circuit, and at least another as a peaking amplifier circuit (See FIG. 8).

Figure 8:
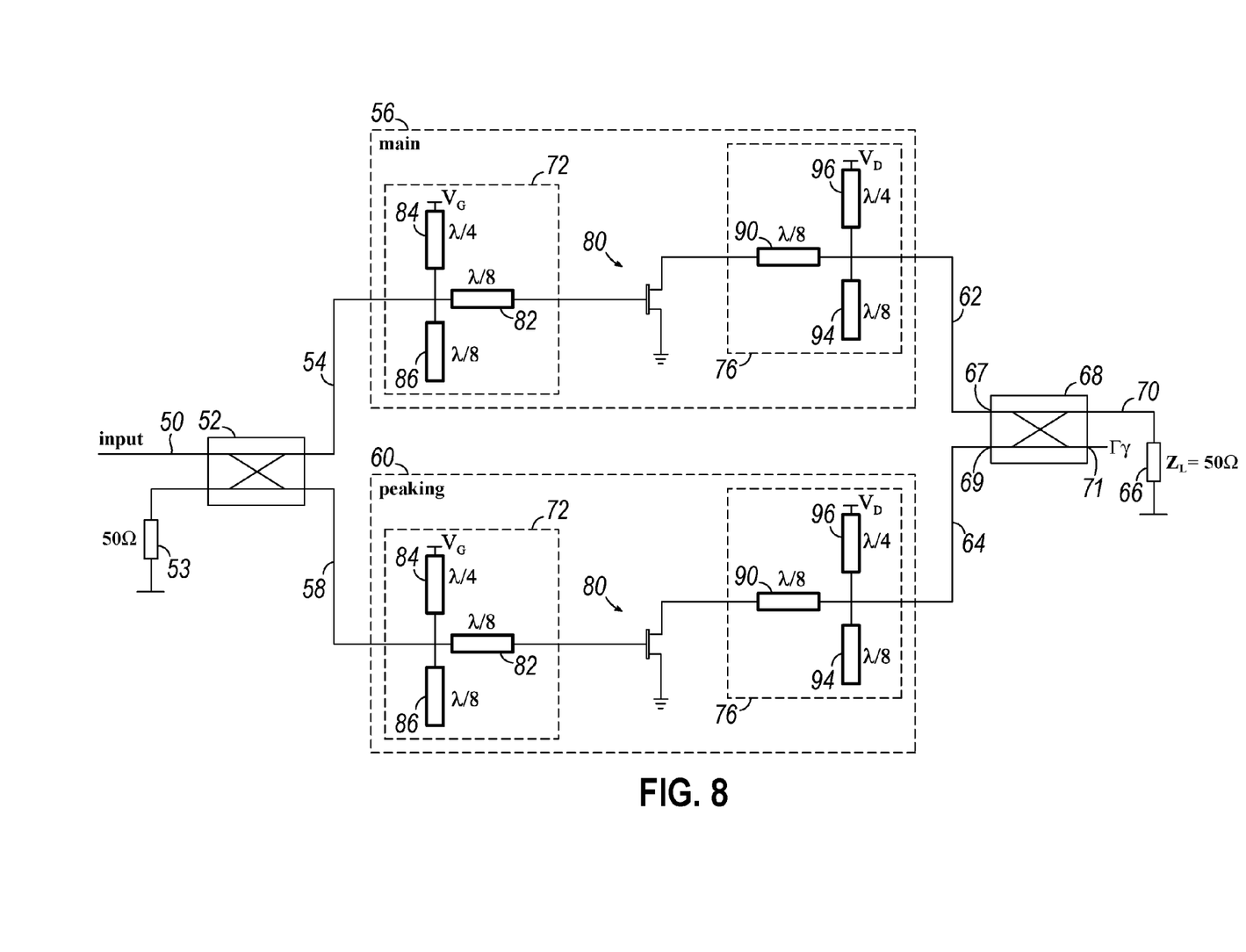
FIG. 8 is a schematic block diagram illustrating one embodiment of the invention.

As illustrated in FIG. 7A, one output from the coupler circuit 52 is coupled through a 50 Ohm line 54, 58 to the input matching and resonator network 72, 74 of the respective amplifier circuit. The combined matching and resonator network incorporates a line element having an effective electrical length of one-eighth of a wavelength ($\lambda/8$) at a fundamental frequency of the amplifier. The networks also have a plurality of stub elements, including a stub element having an effective electrical length of one-eighth of a wavelength ($\lambda/8$) at the fundamental frequency, and a stub element having an effective electrical length of one-fourth of a wavelength ($\lambda/4$) at a fundamental frequency. More specifically, referring to FIG. 7A, in one embodiment of the invention, the network 72, 74 incorporates a $\lambda/8$ wavelength line to provide an input signal to active device 80, such as to the gate of the active device. The line element 82 is coupled at one end to the input of the active device (such as a gate). The $\lambda/8$ wavelength line element 82 is further electrically coupled at the other end with a $\lambda\lambda/4$ wavelength stub 84 that is coupled to a voltage source $V_G$ for providing the gate biasing to the gate of device 80. A $\lambda/8$ wavelength stub element 86 is also electrically coupled with the line and stub elements 82 and 84 at that end. Together, the $\lambda/8$ wavelength line element, the $\lambda/8$ wavelength stub element, and the $\lambda/4$ wavelength stub element act as a combination matching and resonator network providing the proper input signal to the active device 80 that operates as an inverse Class-F device and amplifier in either the main amplifier circuit or peaking amplifier circuit 56, 60. While FIG. 7A illustrates one amplifier circuit, such as for a main amplifier, a similar arrangement is also utilized for the peaking amplifier in one exemplary embodiment of the invention. FIG. 8 illustrates such circuits in both the main signal branch and the peaking signal branch, similar to the arrangement, as illustrated in FIG. 6.

Turning again to FIG. 7A, that figure illustrates an exemplary amplifier circuit configured in accordance with the invention, also with an integrated output matching and resonator network 76, 78. The output matching and resonator network also incorporates an arrangement of transmission lines and stubs similar to the input matching and resonator network 72, 74. Specifically, the output of the active device 80, such as at the drain of the device, is coupled through a $\lambda/8$ wavelength line 90 element, to a 50 Ohm line 62, 64 at the output. The output of the amplifier 56, 60 would then feed one of the inputs 67, 69 to the coupler circuit 68 (See FIG. 6). The output coupler circuit 68 receives the output signals from both the main amplifier and peaking amplifier circuits, and combines those outputs into a single output. As noted, one output of coupler circuit 68 indicated as 70 in FIG. 6, feeds an appropriate load element 66. The other output 71 of the coupler circuit is terminated with a termination that provides a desirable reflection coefficient $\Gamma_Y$ as noted above. Through the output coupler circuit 68, both of the outputs from the main amplifier and peaking amplifier combine and are directed to the load 66. The coupler circuit, in one exemplary embodiment, might be a 3 dB hybrid coupler circuit.

Turning again to FIG. 7A, coupled with output line element 90 at the end opposite the drain is another $\lambda/8$ wavelength stub element 94. The $\lambda/8$ wavelength line element 90 is coupled through 50 Ohm line 62, 64, to coupler circuit 68. To provide bias to the drain of active device 80, the biasing signal $V_D$ is provide to the drain through a $\lambda/4$ wavelength stub element 90 that is coupled at an end of line element 90 adjacent stub element 94, as illustrated in FIG. 7A.

Figure 9:
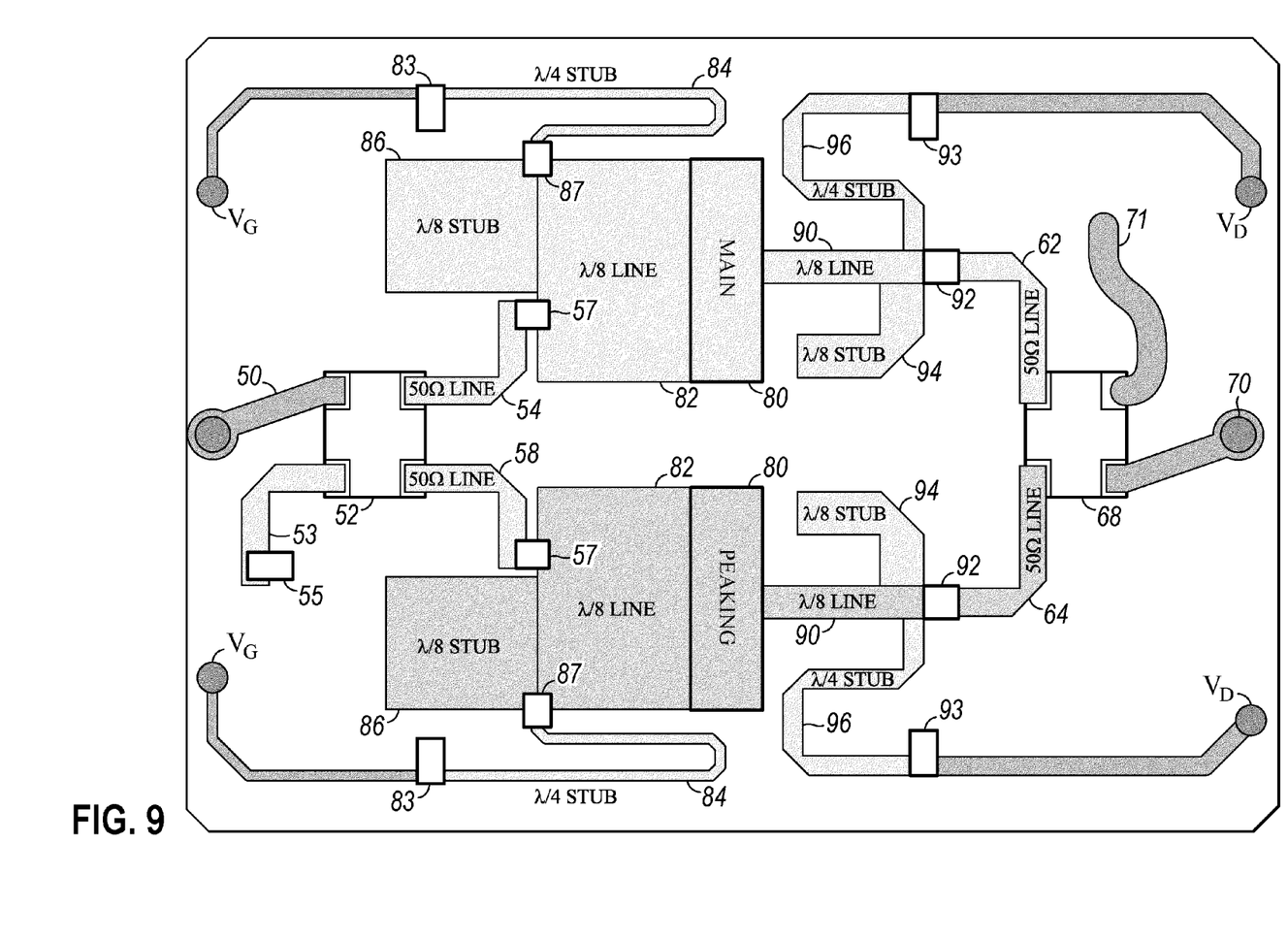
FIG. 9 is a plan diagram of a microstrip circuit for implementing one embodiment of the present invention.

While FIG. 7A only illustrates one of the amplifier paths, as noted, FIGS. 6 and 9 illustrate both the main amplifier circuit and the peaking amplifier circuit. The output matching resonator network 78 of the peaking amplifier circuit is similarly constructed and arranged like the main amplifier network, as noted herein for FIG. 7A, including a $\lambda/8$ wavelength line element coupled with a $\lambda/8$ wavelength stub element, and a $\lambda/4$ wavelength stub element, as illustrated. The output lines 62, 64 both feed into appropriate input ports 67, 69 to the output coupler circuit 68, where the output signals are combined, and provided to load element 66.

The various line elements 82, 90, and stub elements 84, 86, 94, 96, as illustrated in FIG. 7A, are reflective of the electrical lengths of those elements at the fundamental frequency $f_o$ of the signals that pass from the input to the output and are to be amplified. However, in accordance with the operation of the inverse Class-F amplifier circuits, at the second harmonic frequency $2f_o$ and the third harmonic frequency $3f_o$, the matching and resonator networks 72, 74, 76, and 78 present line and stub elements with different effective electrical lengths to the input signals that provide desirable open circuit conditions and short circuit conditions at the appropriate inputs and outputs to the active device 80, in accordance with the operation of the inverse Class-F architecture and the invention.

As illustrated in FIG. 7B, for signals at the second harmonic frequency $2f_o$, the active device is presented with an open circuit condition at the drain output and gate input. The $\lambda/8$ wavelength elements 82, 90 are effectively transformed into $\lambda/4$ wavelength elements. Similarly, as shown in FIG. 7B, the $\lambda/4$ wavelength stubs and $\lambda/8$ wavelength stubs appear as $\lambda/2$ wavelength, and $\lambda/4$ wavelength stubs, respectively, in the matching and resonator networks. As shown in FIG. 7B, the open circuit condition at the drain for a second harmonic signal is presented as a short circuit to the output coupler and lines 62, 64. Due to the impedance transformation, the output of the amplifier circuit, through the output matching and resonator network 76, 78, presents a short circuit condition to the 50 Ohm line, and the input to the output coupler circuit 68.

Alternatively, for signals at the third harmonic frequency $3f_o$, a short circuit condition is presented at the input gate and the drain of the active device 80. Referring to FIG. 7C, the lines 82, 90 are seen as $3\lambda/8$ wavelength lines, while the stubs 84, 86, 94, 96 are seen as $3\lambda/4$ wavelength and $3\lambda/8$ wavelength stubs. The short circuit condition presents an open circuit condition at the output of the amplifier circuit coupled with the 50 Ohm line 62, 64 and output coupler circuit 68.

FIGS. 7A-7C illustrate an idealized or optimized output network. In implementation, according to the invention, the impedance at the internal drain of the active device 80 is taken into account at the fundamental frequency, the second harmonic frequency, and the third harmonic frequency. When such impedance is considered, the lengths of the various transmission line sections 90 and stubs 94, 96 are considered and are adjusted appropriately to compensate for the parasitic effects of the active device 80 in order to provide the desirable conditions at the output of the drain.

Turning to FIG. 9, in accordance with another aspect of the invention, the quasi-Doherty architecture incorporating the inverse Class-F main amplifier circuit and peaking amplifier circuit is implemented on a circuit board utilizing minimally-sized input and output microstrip components and networks, including the appropriate line sections and stub elements described herein for the combined matching and resonator networks.

The exemplary embodiment, as illustrated in FIGS. 6 and 8, is shown implemented on a board with microstrip elements and other appropriate circuit element for implementing the quasi-Doherty amplifier architecture utilizing an inverse Class-F amplifier design with integral and combined input matching and resonator networks and integral and combined output matching and resonator networks, in accordance with the invention. Using like reference numerals, as illustrated in FIGS. 6-8, an input signal 50 to be amplified is presented to coupler circuit 52, which divides the signal and provides a portion of the input signal 50 to the main amplifier path, and another portion of the input to the peaking amplifier path. The 50 Ohm line elements 54, 58 provide one portion of the input signal through a DC decoupling capacitor element 57, to the $\lambda/8$ wavelength input line 82. A bias signal such as a gate bias $V_G$ is provided through capacitor element 83 to an RF $\lambda/4$ wavelength stub element 84. Capacitor element 83 is a bypass capacitor to ground, and may typically have a value of around $10_p$F. The stub element 84 couples with $\lambda/8$ wavelength stub element 86 and the $\lambda/8$ wavelength input line 82 through an appropriate resistor 87. The resistor reduces/prevents the circuit from experiencing self-oscillation, and may have a typical value around 10-70 Ohms.

Referring to the bottom portion of FIG. 9, the active element 80 of the peaking amplifier circuit 60 is provided with an input signal from coupler circuit 52, in a similar fashion through the noted 50 Ohm line element 53, and the $\lambda/8$ wavelength line element 82, and a gate bias signal $V_G$ in the $\lambda/4$ wavelength stub element and appropriate capacitor elements and resistor elements. As noted above, in one embodiment of the invention, the coupler circuit may include a 3 dB hybrid coupler circuit to provide an equal split of the input signal between both the main amplifier circuit and the peaking amplifier circuit.

In accordance with one aspect of the invention, the various microstrip line elements 82 and stub elements 84, 86 provide a combined signal matching network and resonator network for each main and peaking path. The signal matching aspects of the invention provide a proper impedance match of the input signal to the active device 80. The resonator aspects of the inventive network also ensure the proper impedance conditions for operation of the inverse Class-F amplifier, in accordance with the invention. All the elements for each of the matching and resonator networks implemented are conveniently positioned with the active devices 80 on a microstrip circuit, as shown in FIG. 9. This eliminates the need to have a separate resonator network for driving the active devices, in accordance with an inverse Class-F operation.

In accordance with another aspect of the invention, an output matching and resonator network 76 is utilized with the inverse Class-F amplifier circuits in combination with the input matching resonator network. Also, the output matching resonator network is similarly configured to the input matching resonator network incorporating a $\lambda/8$ wavelength output line element coupled with an appropriate $\lambda/8$ wavelength stub, and a $\lambda/4$ wavelength stub at the output of the active device. The network is coupled to the output lines 62, 64, and inputs to coupler circuit 68 by appropriate DC decoupling bypass capacitors 92. A drain bias signed $V_D$ is provided for each amplifier circuit through $\lambda/4$ wavelength stub element 96, using a bypass capacitor 93 having a typical value of around $10_p$F.

As may be appreciated, depending upon the input impedance or output impedance of the active device 80, such as a transistor, the microstrip implementations of the $\lambda/8$ wavelength line, the $\lambda/8$ wavelength stub element, and the $\lambda/4$ wavelength stub element will have different dimensions and sizes as appropriate in a microstrip form for matching to a 50 Ohm line input to the various input and output coupler circuits accordingly, as illustrated in FIG. 9. For example, the output impedance of the active device 80 is generally going to be lower than the input impedance, and, therefore, the dimensions of the microstrip $\lambda/8$ wavelength line component would be adjusted accordingly to transform the impedance to the 50 Ohm lines 62, 64. The line elements 90 are generally going to be smaller in microstrip dimensions than the line elements 82 at the input to the active devices 80. Also, the sizes of the $\lambda/8$ wavelength stub element 94 and $\lambda/4$ wavelength stub element

96 may also be smaller in microstrip dimensions than those of the input network 72, as illustrated in the embodiments of FIG. 9.

Accordingly, the present invention provides a unique amplifier design for amplifying RF signals, and particularly RF signals that have a high peak-to-average ratio. A specific quasi-Doherty architecture is implemented incorporating inverse Class-F main and peaking amplifiers that may be defined using a minimally-sized input and output microstrip network for providing the desired signal matching and resonator characteristics. Specifically, a combination of input lines and appropriate stubs are used to provide proper matching for the input signals to the active devices, and also to ensure the proper operation of the inverse Class-F amplifier topology in the amplifier. In that way, efficiency is increased in a small design package, which does not require separate resonator networks.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicant's general inventive concept.

What is claimed is:

1. An amplifier comprising:
   a main amplifier circuit;
   at least one peaking amplifier circuit, the at least one peaking amplifier circuit being selectively operable to operate in combination with the main amplifier circuit,
   wherein at least one of the main amplifier circuit and the at least one peaking amplifier circuit includes an active device having an input and an output and operating as an inverse Class-F amplifier, and
   wherein the at least one of the main amplifier circuit and the at least one peaking amplifier circuit that includes the active device further including a combined matching and resonator network having a line element with an effective electrical length of one-eighth of a wavelength at a fundamental frequency of the amplifier that is coupled at one end with the output of the active device and having a stub element having an effective electrical length of one-eighth of a wavelength at a fundamental frequency that is coupled at another end of the line element;
   at least one coupler circuit coupled with outputs of the main amplifier circuit and the at least one peaking amplifier circuit to combine amplifier circuit output signals at a coupler first output port; and
   a coupler second output port terminated with a termination operable for providing a reflection coefficient that is based upon the reflection coefficient at the output of at least one of the main amplifier circuit and the at least one peaking amplifier circuit.

2. The amplifier of claim 1 wherein each of the main amplifier circuit and the at least one peaking amplifier circuit is operating as an inverse Class-F amplifier.

3. The amplifier of claim 1 wherein the combined matching and resonator network is coupled with the output of the active device so the active device operates as an inverse Class-F device.

4. The amplifier of claim 1 wherein the at least one peaking amplifier circuit that includes an active device includes a combined matching and resonator network coupled with the input of the active device.

5. The amplifier of claim 1 wherein each of the main amplifier circuit and the at least one peaking amplifier circuit includes an active device and a combined matching and resonator network coupled with the output of each of the active devices.

6. The amplifier of claim 5 wherein each of the main amplifier circuit and the at least one peaking amplifier circuit includes a combined matching and resonator network coupled with the input of each of the active devices.

7. The amplifier of claim 1 wherein the combined matching and resonator network further incorporates another stub element having an effective electrical length of one-fourth of a wavelength at a fundamental frequency, the stub element coupled with the line and one-eighth wavelength stub elements.

8. The amplifier of claim 1 wherein the combined matching and resonator network coupled with the output presents an open circuit condition at the output of the active device at a second harmonic frequency of a fundamental frequency for the amplifier.

9. The amplifier of claim 1 wherein the combined matching and resonator network coupled with the output presents a short circuit condition at the
   output of the active device at a third harmonic frequency of a fundamental frequency for the amplifier.

10. The amplifier of claim 1 wherein the line element and stub element of the combined matching and resonator network are implemented in a microstrip circuit.

11. The amplifier of claim 1 further comprising a coupler circuit coupled to an input of the amplifier to divide an input signal between the main amplifier circuit and the at least one peaking amplifier circuit.

12. The amplifier of claim 1 wherein the termination includes a circuit configuration reflecting at least one of an open circuit or a closed circuit to the coupler second output port.

13. The amplifier of claim 1 wherein the active device includes at least one of a gallium-nitride high electron mobility transistor or an LDMOS device.

14. An amplifier comprising:
   a main amplifier circuit;
   at least one peaking amplifier circuit, the at least one peaking amplifier circuit being selectively operable to operate in combination with the main amplifier circuit;
   the main amplifier circuit and the at least one peaking amplifier circuit each including an active device having an input and an output and operating as an inverse Class-F amplifier element;
   the main amplifier circuit and the at least one peaking amplifier circuit each including a combined matching and resonator network coupled with an input of the respective active device and a combined matching and resonator network coupled with an output of the respective active device;
   at least one of the combined matching and resonator networks having a line element with an effective electrical length of one-eighth of a wavelength at a fundamental frequency of the amplifier that is coupled at one end with an input or output of the active device and having a stub element having an effective electrical length of one-eighth of a wavelength at a fundamental frequency that is coupled at another end of the line element.

15. The amplifier of claim 14 further comprising at least one coupler circuit coupled with outputs of the main amplifier circuit and the at least one peaking amplifier circuit to combine amplifier circuit output signals at a coupler first output port, and a coupler second output port terminated with a termination
   operable for providing a reflection coefficient that is based upon the reflection coefficient at the output of at least one of the main amplifier circuit and the at least one peaking amplifier circuit.

16. The amplifier of claim 14 wherein the at least one combined matching and resonator network further incorporates a line another stub element having an effective electrical length of one-fourth of a wavelength at a fundamental frequency, the stub element coupled with the line and one-eighth wavelength stub elements.

17. The amplifier of claim 16 wherein the line element and stub elements of the combined matching and resonator network are implemented in a microstrip circuit.

18. The amplifier of claim 15 wherein the termination includes a circuit configuration reflecting at least one of an open circuit condition or a short circuit condition to the coupler second output port.

19. The amplifier of claim 14 wherein the combined matching and resonator network coupled with the output of the active device presents an open circuit condition at the output at a second harmonic frequency of a fundamental frequency for the amplifier.

20. The amplifier of claim 14 wherein the combined matching and resonator network coupled with the output of the active device presents a short circuit condition at the output at a third harmonic frequency of a fundamental frequency for the amplifier.

* * * * *